United States Patent
Hendrickx et al.

(10) Patent No.: US 8,510,686 B2
(45) Date of Patent: Aug. 13, 2013

(54) INVERSE LITHOGRAPHY FOR HIGH TRANSMISSION ATTENUATED PHASE SHIFT MASK DESIGN AND CREATION

(75) Inventors: Eric Henri Jan Hendrickx, Lubbeck (BE); Alexander V. Tritchkov, Hillsboro, OR (US); Kyohei Sakajiri, Portland, OR (US)

(73) Assignee: IMEC, Leuven (BE)

( * ) Notice: Subject to any disclaimer, the term of this patent is extended or adjusted under 35 U.S.C. 154(b) by 0 days.

(21) Appl. No.: 13/250,971

(22) Filed: Sep. 30, 2011

(65) Prior Publication Data

US 2012/0117523 A1 May 10, 2012

Related U.S. Application Data

(63) Continuation of application No. 12/416,037, filed on Mar. 31, 2009, now abandoned.

(60) Provisional application No. 61/154,141, filed on Feb. 20, 2009.

(51) Int. Cl.
*G06F 17/50* (2006.01)

(52) U.S. Cl.
USPC ............................................ 716/55; 716/119

(58) Field of Classification Search
USPC ................................................... 716/55, 119
See application file for complete search history.

(56) References Cited

U.S. PATENT DOCUMENTS

| | | | |
|---|---|---|---|
| 7,487,489 B2 | 2/2009 | Granik | |
| 7,519,940 B2 * | 4/2009 | Huang et al. | 716/54 |
| 2007/0198963 A1 | 8/2007 | Granik et al. | |
| 2008/0274414 A1 | 11/2008 | Chen | |

OTHER PUBLICATIONS

Yuri Granik, "Solving Inverse Problems of Optical Microlithography", Proceedings of SPIE 5754, pp. 506-526, 2004.
Nishrin Kachwala et al., "High Transmission Attenuated PSM—Benefits and Limitations Through a Validation Study of 33%, 20% and 6% Transmission Masks", Proceedings of SPIE 4000, 2000.
Yuri Granik, "Source Optimization for Image Fidelity and Throughput", JM 3(4), 2004 Society of Photo-Optical Instrumentation Engineers, pp. 509-522, Oct. 2004.
Kyohei Sakajiri et al., "Model-Based SRAF Insertion Through Pixel-Based Mask Optimization at 32nm and Beyond", Proceedings of SPIE vol. 7028, pp. 702811-1-702811-12, 2008.

* cited by examiner

*Primary Examiner* — Thuan Do
(74) *Attorney, Agent, or Firm* — Knobbe, Martens, Olson & Bear LLP

(57) ABSTRACT

Various implementations of the invention provide for generation of a high transmission phase shift mask layout through inverse lithography techniques. In various implementations of the present invention, a set of mask data having a plurality of pixels is generated. The transmission value associated with each pixel may then be determined through an inverse lithography technique. With various implementations of the invention, the inverse lithography technique identifies an objective function, minimizes the objective function in relation to a simulation of the optical lithographic process, such that the transmission value, which is greater than 6%, may be determined.

21 Claims, 10 Drawing Sheets

INVERSE LITHOGRAPHY FOR HIGH TRANSMISSION ATTENUATED PHASE SHIFT MASK DESIGN AND CREATION

RELATED APPLICATIONS

This application is a continuation of U.S. application Ser. No. 12/416,037, filed Mar. 31, 2009, which claims priority under 35 U.S.C. §119(e) to U.S. provisional patent Application No. 61/154,141 filed on Feb. 20, 2009. Each of the above application is incorporated herein by reference in its entirety.

FIELD OF THE INVENTION

The invention relates to the field optical lithographic mask design or creation. More particularly, various implementations of the invention relate to creating and generating high transmission mask for use in a lithographic process.

BACKGROUND OF THE INVENTION

Electronic circuits, such as integrated microcircuits, are used in a variety of products, from automobiles to microwaves to personal computers. Designing and fabricating microcircuit devices typically involves many steps, sometimes referred to as the "design flow." The particular steps of a design flow often are dependent upon the type of microcircuit, its complexity, the design team, and the microcircuit fabricator or foundry that will manufacture the microcircuit. Typically, software and hardware "tools" verify the design at various stages of the design flow by running software simulators and/or hardware emulators. These steps aid in the discovery of errors in the design, and allow the designers and engineers to correct or otherwise improve the design. These various microcircuits are often referred to as integrated circuits (IC's).

Several steps are common to most design flows. Initially, the specification for a new circuit is transformed into a logical design, sometimes referred to as a register transfer level (RTL) description of the circuit. With this logical design, the circuit is described in terms of both the exchange of signals between hardware registers and the logical operations that are performed on those signals. The logical design typically employs a Hardware Design Language (HDL), such as the Very high speed integrated circuit Hardware Design Language (VHDL). The logic of the circuit is then analyzed, to confirm that it will accurately perform the functions desired for the circuit. This analysis is sometimes referred to as "functional verification."

After the accuracy of the logical design is confirmed, it is converted into a device design by synthesis software. The device design, which is typically in the form of a schematic or netlist, describes the specific electronic devices (such as transistors, resistors, and capacitors) that will be used in the circuit, along with their interconnections. This device design generally corresponds to the level of representation displayed in conventional circuit diagrams. The relationships between the electronic devices are then analyzed, to confirm that the circuit described by the device design will correctly perform the desired functions. This analysis is sometimes referred to as "formal verification." Additionally, preliminary timing estimates for portions of the circuit are often made at this stage, using an assumed characteristic speed for each device, and incorporated into the verification process.

Once the components and their interconnections are established, the design is again transformed, this time into a physical design that describes specific geometric elements. This type of design often is referred to as a "layout" design. The geometric elements, which typically are polygons, define the shapes that will be created in various layers of material to manufacture the circuit. Typically, a designer will select groups of geometric elements representing circuit device components (e.g., contacts, channels, gates, etc.) and place them in a design area. These groups of geometric elements may be custom designed, selected from a library of previously-created designs, or some combination of both. Lines are then routed between the geometric elements, which will form the wiring used to interconnect the electronic devices. Layout tools (often referred to as "place and route" tools), such as Mentor Graphics' IC Station or Cadence's Virtuoso, are commonly used for both of these tasks.

IC layout descriptions can be provided in many different formats. The Graphic Data System II (GDSII) format is a popular format for transferring and archiving two-dimensional graphical IC layout data. Among other features, it contains a hierarchy of structures, each structure containing layout elements (e.g., polygons, paths or poly-lines, circles and textboxes). Other formats include an open source format named OpenAccess, Milkyway by Synopsys, Inc., EDDM by Mentor Graphics, Inc., and the more recent Open Artwork System Interchange Standard (OASIS) proposed by Semiconductor Equipment and Materials International (SEMI). These various industry formats are used to define the geometrical information in IC layout designs that are employed to manufacture integrated circuits. Once the microcircuit device design is finalized, the layout portion of the design can be used by fabrication tools to manufacturer the device using a photolithographic process.

There are many different fabrication processes for manufacturing a circuit, but most processes include a series of steps that deposit layers of different materials on a substrate, expose specific portions of each layer to radiation, and then etch the exposed (or non-exposed) portions of the layer away. For example, a simple semiconductor device component could be manufactured by the following steps. First, a positive type epitaxial layer is grown on a silicon substrate through chemical vapor deposition. Next, a nitride layer is deposited over the epitaxial layer. Then specific areas of the nitride layer are exposed to radiation, and the exposed areas are etched away, leaving behind exposed areas on the epitaxial layer, (i.e., areas no longer covered by the nitride layer). The exposed areas then are subjected to a diffusion or ion implantation process, causing dopants, for example phosphorus, to enter the exposed epitaxial layer and form charged wells. This process of depositing layers of material on the substrate or subsequent material layers, and then exposing specific patterns to radiation, etching, and dopants or other diffusion materials, is repeated a number of times, allowing the different physical layers of the circuit to be manufactured.

Each time that a layer of material is exposed to radiation, a mask must be created to expose only the desired areas to the radiation, and to protect the other areas from exposure. The mask is created from circuit layout data. That is, the geometric elements described in layout design data define the relative locations or areas of the circuit device that will be exposed to radiation through the mask. A mask or reticle writing tool is used to create the mask or reticle based upon the layout design data, after which the mask can be used in a photolithographic process. A mask is traditionally created by covering selected portions of a transparent "plate" with a material that does not transmit light. The image or features created in the mask after the non-transmitting material is applied are often referred to as the intended or target images, while the image created on the substrate, by employing the mask in the photolithographic process is referred to as the printed image.

As designers and manufacturers continue to increase the number of circuit components in a given area and/or shrink the size of circuit components, the shapes reproduced on the substrate become smaller and are placed closer together. This reduction in feature size increases the difficulty of faithfully reproducing the image intended by the layout design onto the substrate. To address this problem, various resolution enhancement techniques (RET) are often employed to improve the fidelity of the optical lithographic process. For example, optical process correction (OPC) may be employed to improve the resolution of the image that the mask forms of the substrate. In traditional resolution enhancement techniques, the optical lithographic process is simulated, and adjustments are made the mask such that the features intended by the designer are more faithfully reproduced on the substrate. Alternatively, or additionally, inverse lithographic techniques may be employed to improve the fidelity of the optical lithographic process.

Inverse lithographic techniques, like resolution enhancement techniques, seek to find a suitable mask, which when employed in a lithographic process will faithfully reproduce the intended features on the substrate. However, inverse lithography begins with the intended printed features and results in a mask. Whereas, resolution enhancement techniques begin with a mask, and iteratively make adjustments to the mask. Inverse lithography applied to microdevice manufacturing is discussed in "Solving Inverse Problems of Optical Microlithography", Yuri Granik, *Proceedings of SPIE* 5754, pp. 506-526 (2004), which article is incorporated entirely herein by reference.

Another technique employed to improve the fidelity of the optical lithographic process are phase shift masks (PSM). In general, a phase shift mask capitalizes on the interference generated by phase differences inherent in the optical lithographic process to improve the resolution of the printed image. One form of phase shift masks are attenuated phase shift masks. An attenuated phase shift mask contains areas of varying light transmitting properties. For example, selected areas of the mask covered by a non-light transmitting material may be modified to allow a small amount of light to be transmitted through the area. The small amount of light transmitted through these selectively modified areas causes interference with the light traveling through the transparent areas of the mask in such a way as to improve the resolution and the process window (PW) of the printed image.

Currently, phase shift masks contain areas of low light transmission, such as 6%. Although experimentation with high light transmission masks (such as for example, 20% and 33%) has been done, background printing of unwanted features due to the higher transmission areas has always resulted. For example, high transmission masks are discussed in "High Transmission Attenuated PSM—Benefits and Limitations Through a Validation Study of 33%, 20% and 6% Transmission Masks" Nishrin Kachwala et al., *Proceedings of SPIE* 4000, (2000), which article is incorporated entirely herein by reference.

High transmission masks are desirable for many reasons, particularly because high transmission masks have a low mask error enhancement factor (MEEF). Mask error enhancement factor is defined as the ratio a change in the mask, for example by moving an edge, will result in a change in the printed image. Accordingly, a low mask error enhancement factor is desired. Additionally, high transmission mask typically have a higher depth of focus (DPF) and a greater uniformity of the critical dimension (CD) of the actual printed wafer. Although some of the issues of background printing of unwanted features can be suppressed by application of a second "patch" layer of non-light transmitting material, such as chrome to selected areas of the mask, this requires a second patterning step in the mask design and creation process. As the second patterning step consumes design, and manufacturing resources, there is a desire to create high transmission attenuated phase shift masks using a single mask patterning step that do not allow unwanted features to be printed on the substrate.

SUMMARY OF THE INVENTION

Various implementations of the invention provide for generation of a high transmission phase shift mask layout through inverse lithography techniques. In various implementations of the present invention, a set of mask data having a plurality of pixels is generated. The transmission value associated with each pixel may then be determined through an inverse lithography technique. With various implementations of the invention, the inverse lithography technique identifies an objective function, minimizes the objective function in relation to a simulation of the optical lithographic process, such that the transmission value, which is greater than 6%, may be determined.

In various implementations of the present invention, a set of mask data having a plurality of main features having a transmission value of 100% and a plurality of phase shift areas having a transmission value greater than 6% are generated. An inverse lithography process may then be employed to determine a size and placement of the main features and the phase shift features in the mask layout.

These and additional aspects of the invention will be further understood from the following detailed disclosure of illustrative embodiments.

BRIEF DESCRIPTION OF THE DRAWINGS

The present invention will be described by way of illustrative embodiments shown in the accompanying drawings in which like references denote similar elements, and in which.

DETAILED DESCRIPTION OF ILLUSTRATIVE IMPLEMENTATIONS

Although the operations of the disclosed methods are described in a particular sequential order for convenient presentation, it should be understood that this manner of description encompasses rearrangements, unless a particular ordering is required by specific language set forth below. For example, operations described sequentially may in some cases be rearranged or performed concurrently. Moreover, for the sake of simplicity, the disclosed flow charts and block diagrams typically do not show the various ways in which particular methods can be used in conjunction with other methods. Additionally, the detailed description sometimes uses terms like "determine" to describe the disclosed methods. Such terms are high-level abstractions of the actual operations that are performed. The actual operations that correspond to these terms will vary depending on the particular implementation and are readily discernible by one of ordinary skill in the art.

Some of the methods described herein can be implemented by software stored on a computer readable storage medium, or executed on a computer. Additionally, some of the disclosed methods may be implemented as part of a computer implemented electronic design automation (EDA) tool. The selected methods could be executed on a single computer or a computer networked with another computer or computers. For clarity, only those aspects of the software germane to these disclosed methods are described; product details well known in the art are omitted.

Illustrative Computing Environment

Various embodiments of the invention are implemented using computer executable software instructions executed by one or more programmable computing devices. Because these examples of the invention may be implemented using software instructions, the components and operation of a generic programmable computer system on which various embodiments of the invention may be employed is described. Further, because of the complexity of some electronic design automation processes and the large size of many circuit designs, various electronic design automation tools are configured to operate on a computing system capable of simultaneously running multiple processing threads. The components and operation of a computer network 101 having a host or master computer and one or more remote or slave computers therefore will be described with reference to FIG. 1. This operating environment is only one example of a suitable operating environment, however, and is not intended to suggest any limitation as to the scope of use or functionality of the invention.

Figure 1:
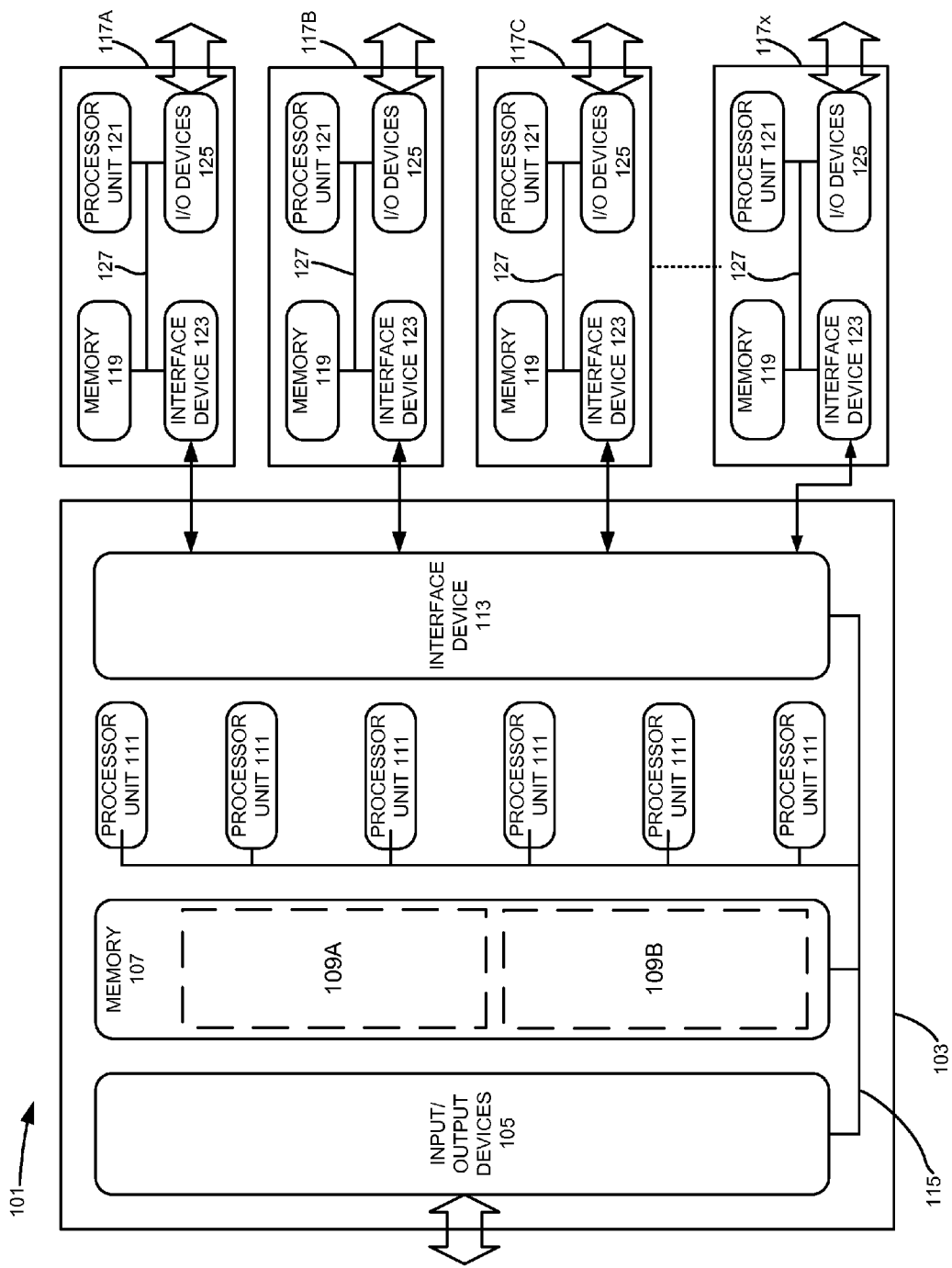
FIG. 1 illustrates an illustrative computing environment.

In FIG. 1, the computer network 101 includes a master computer 103. In the illustrated example, the master computer 103 is a multi-processor computer that includes a plurality of input and output devices 105 and a memory 107. The input and output devices 105 may include any device for receiving input data from or providing output data to a user. The input devices may include, for example, a keyboard, microphone, scanner or pointing device for receiving input from a user. The output devices may then include a display monitor, speaker, printer or tactile feedback device. These devices and their connections are well known in the art, and thus will not be discussed at length here.

The memory 107 may similarly be implemented using any combination of computer readable media that can be accessed by the master computer 103. The computer readable media may include, for example, microcircuit memory devices such as random access memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information.

As will be discussed in detail below, the master computer 103 runs a software application for performing one or more operations according to various examples of the invention. Accordingly, the memory 107 stores software instructions 109A that, when executed, will implement a software application for performing one or more operations. The memory 107 also stores data 109B to be used with the software application. In the illustrated embodiment, the data 109B contains process data that the software application uses to perform the operations, at least some of which may be parallel.

The master computer 103 also includes a plurality of processor units 111 and an interface device 113. The processor units 111 may be any type of processor device that can be programmed to execute the software instructions 109A, but will conventionally be a microprocessor device. For example, one or more of the processor units 111 may be a commercially generic programmable microprocessor, such as Intel® Pentium® or Xeon™ microprocessors, Advanced Micro Devices Athlon™ microprocessors or Motorola 68K/Coldfire® microprocessors. Alternately or additionally, one or more of the processor units 111 may be a custom manufactured processor, such as a microprocessor designed to optimally perform specific types of mathematical operations. The interface device 113, the processor units 111, the memory 107 and the input/output devices 105 are connected together by a bus 115.

Figure 2:
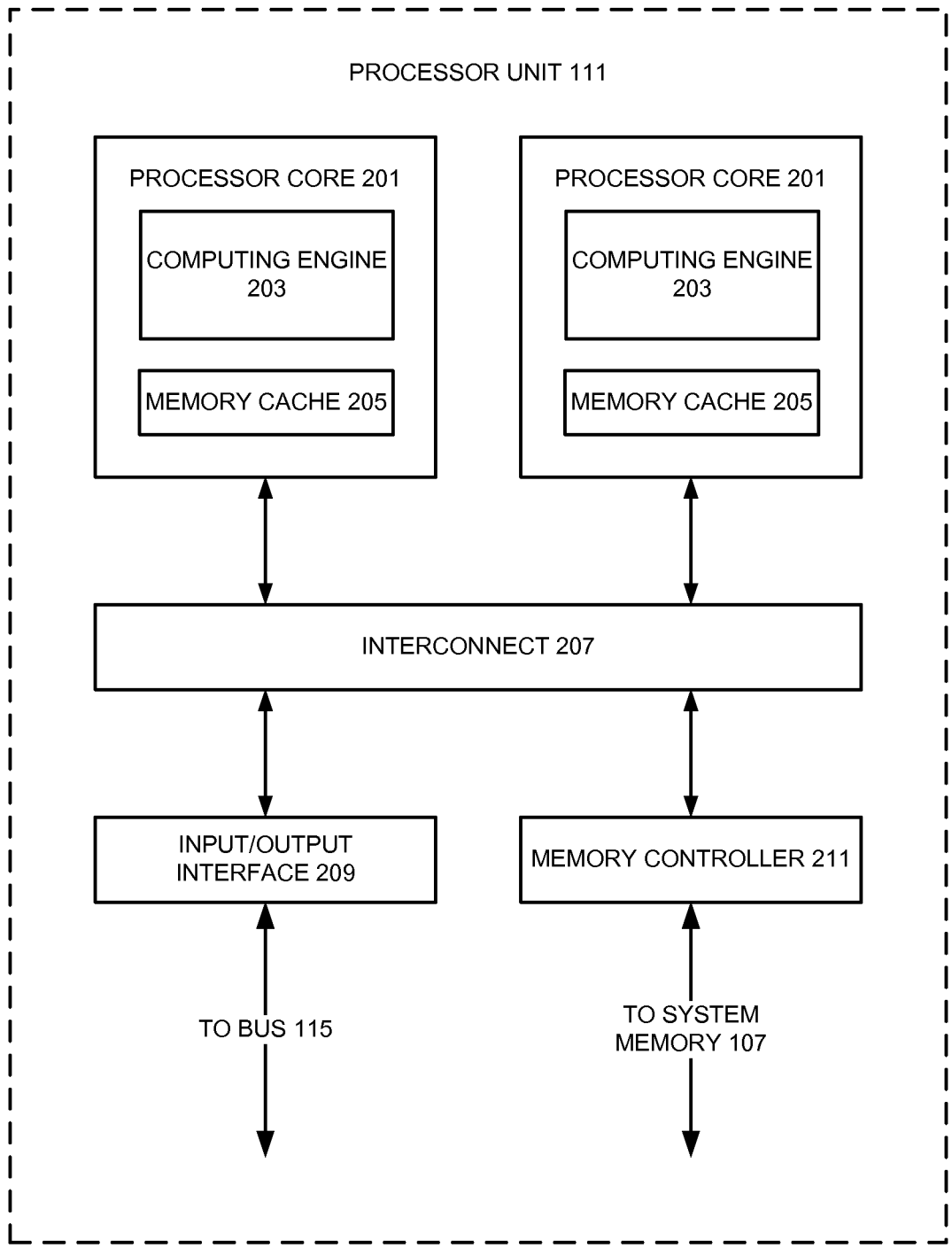
FIG. 2 illustrates a portion of the illustrative computing environment of FIG. 1, shown in further detail.

With some implementations of the invention, the master computing device 103 may employ one or more processing units 111 having more than one processor core. Accordingly, FIG. 2 illustrates an example of a multi-core processor unit 111 that may be employed with various embodiments of the invention. As seen in this figure, the processor unit 111 includes a plurality of processor cores 201. Each processor core 201 includes a computing engine 203 and a memory cache 205. As known to those of ordinary skill in the art, a computing engine contains logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203 may then use its corresponding memory cache 205 to quickly store and retrieve data and/or instructions for execution.

Each processor core 201 is connected to an interconnect 207. The particular construction of the interconnect 207 may vary depending upon the architecture of the processor unit 201. With some processor cores 201, such as the Cell Broadband Engine™ (Cell) microprocessor created by Sony Corporation, Toshiba Corporation and IBM Corporation, the interconnect 207 may be implemented as an interconnect bus. With other processor cores 201, however, such as the Opteron™ and Athlon™ dual-core processors available from Advanced Micro Devices of Sunnyvale, Calif., the interconnect 207 may be implemented as a system request interface device. In any case, the processor cores 201 communicate through the interconnect 207 with an input/output interfaces 209 and a memory controller 211. The input/output interface 209 provides a communication interface between the processor unit 111 and the bus 115. Similarly, the memory controller 211 controls the exchange of information between the processor unit 111 and the system memory 107. With some implementations of the invention, the processor units 111 may include additional components, such as a high-level cache memory accessible shared by the processor cores 201.

While FIG. 2 shows one illustration of a processor unit 111 that may be employed by some embodiments of the invention, it should be appreciated that this illustration is representative only, and is not intended to be limiting. For example, some embodiments of the invention may employ a master computer 103 with one or more Cell processors. The Cell processor employs multiple input/output interfaces 209 and multiple memory controllers 211. Also, the Cell processor has nine different processor cores 201 of different types. More particularly, it has six or more synergistic processor elements (SPEs) and a power processor element (PPE). Each synergistic processor element has a vector-type computing engine 103 with 128×128 bit registers, four single-precision floating point computational units, four integer computational units, and a 256 KB local store memory that stores both instructions and data. The power processor element then controls that tasks performed by the synergistic processor elements. Because of its configuration, the Cell processor can perform some mathematical operations, such as the calculation of fast Fourier transforms (FFTs), at substantially higher speeds than many conventional processors.

It also should be appreciated that, with some implementations, a multi-core processor unit 111 can be used in lieu of multiple, separate processor units 111. For example, rather than employing six separate processor units 111, an alternate implementation of the invention may employ a single processor unit 111 having six cores, two multi-core processor units 111 each having three cores, a multi-core processor unit 111 with four cores together with two separate single-core processor units 111, or other desired configuration.

Returning now to FIG. 1, the interface device 113 allows the master computer 103 to communicate with the slave computers 117A, 117B, 117C ... 117x through a communication interface. The communication interface may be any suitable type of interface including, for example, a conventional wired network connection or an optically transmissive wired network connection. The communication interface may also be a wireless connection, such as a wireless optical connection, a radio frequency connection, an infrared connection, or even an acoustic connection. The interface device 113 translates data and control signals from the master computer 103 and each of the slave computers 117 into network messages according to one or more communication protocols, such as the transmission control protocol (TCP), the user datagram protocol (UDP), and the Internet protocol (IP). These and other conventional communication protocols are well known in the art, and thus will not be discussed here in more detail.

Each slave computer 117 may include a memory 119, a processor unit 121, an interface device 123, and, optionally, one more input/output devices 125 connected together by a system bus 127. As with the master computer 103, the optional input/output devices 125 for the slave computers 117 may include any conventional input or output devices, such as keyboards, pointing devices, microphones, display monitors, speakers, and printers. Similarly, the processor units 121 may be any type of conventional or custom-manufactured programmable processor device. For example, one or more of the processor units 121 may be commercially generic programmable microprocessors, such as Intel® Pentium® or Xeon™ microprocessors, Advanced Micro Devices Athlon™ microprocessors or Motorola 68K/Coldfire® microprocessors. Alternately, one or more of the processor units 121 may be custom manufactured processors, such as microprocessors designed to optimally perform specific types of mathematical operations. Still further, one or more of the processor units 121 may have more than one core, as described with reference to FIG. 2 above. For example, with some implementations of the invention, one or more of the processor units 121 may be a Cell processor. The memory 119 then may be implemented using any combination of the computer readable media discussed above. Like the interface device 113, the interface devices 123 allow the slave computers 117 to communicate with the master computer 103 over the communication interface.

In the illustrated example, the master computer 103 is a multi-processor unit computer with multiple processor units 111, while each slave computer 117 has a single processor unit 121. It should be noted, however, that alternate implementations of the invention may employ a master computer having single processor unit 111. Further, one or more of the slave computers 117 may have multiple processor units 121, depending upon their intended use, as previously discussed. Also, while only a single interface device 113 or 123 is illustrated for both the master computer 103 and the slave computers 117, it should be noted that, with alternate embodiments of the invention, either the master computer 103, one or more of the slave computers 117, or some combination of both may use two or more different interface devices 113 or 123 for communicating over multiple communication interfaces.

With various examples of the invention, the master computer 103 may be connected to one or more external data storage devices. These external data storage devices may be implemented using any combination of computer readable media that can be accessed by the master computer 103. The computer readable media may include, for example, microcircuit memory devices such as random access memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information. According to some implementations of the invention, one or more of the slave computers 117 may alternately or additions be connected to one or more external data storage devices. Typically, these external data storage devices will include data storage devices that also are connected to the master computer 103, but they also may be different from any data storage devices accessible by the master computer 103.

It also should be appreciated that the description of the computer network illustrated in FIG. 1 and FIG. 2 is provided as an example only and is not intended to suggest any limitation as to the scope of use or functionality of alternate embodiments of the invention.

Inverse Lithography

Figure 3:
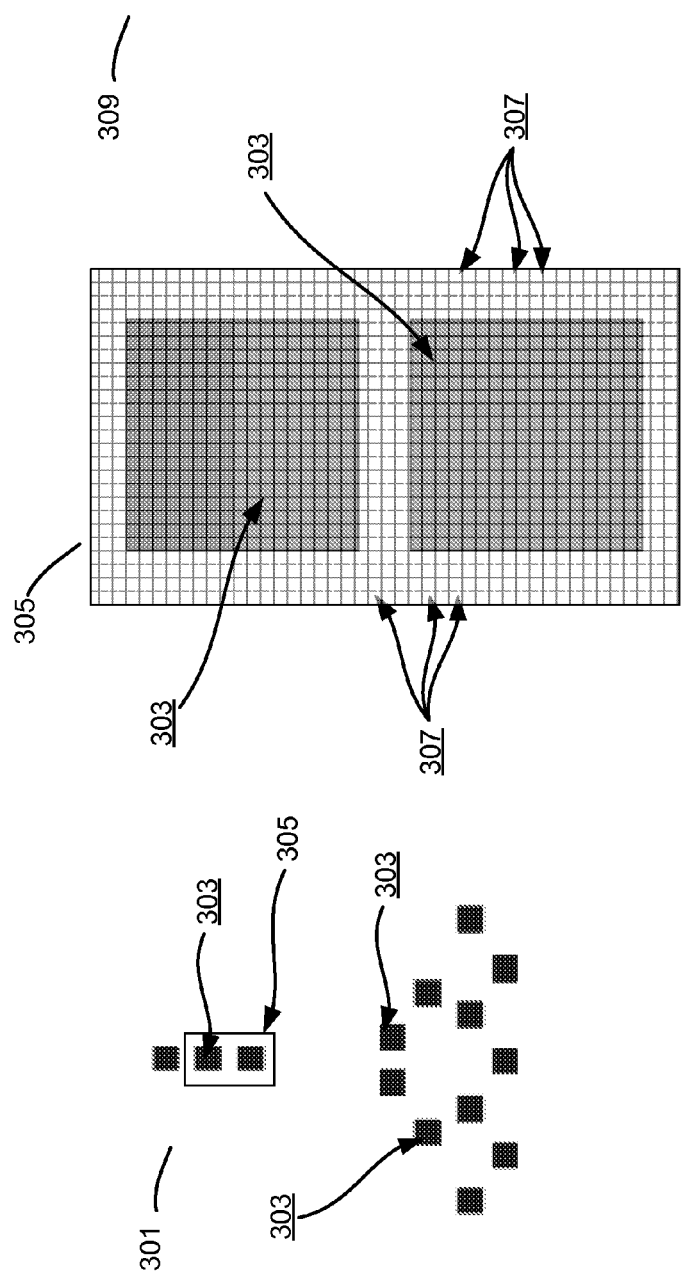
FIG. 3A illustrates a target layout design.
FIG. 3B illustrates a portion of the target layout design of FIG. 3A, shown in greater detail.
FIG. 3C illustrates a layout design for a mask corresponding to the target layout design of FIG. 3A.

As stated above, inverse lithography begins with an intended image, often referred to as a target layout and determines a transmission value for selected areas of a mask, often referred to as pixels, such that the target layout will be realized by employment of the mask in an optical lithographic process. FIG. 3A illustrates a target layout 301. As can be seen from this figure, the target layout 301 includes features 303, which, under ideal conditions would be exactly printed onto a substrate through an optical lithographic process. As stated, inverse lithography masks are determined by taking an intended image, such as the target layout 301, and for select coordinates or pixels on the image, determining a transmission value. For example, FIG. 3B illustrates a region 305 of the target layout 301. As can be seen from this figure, the region 305 has been divided into a plurality of pixels 307.

Figure 4:
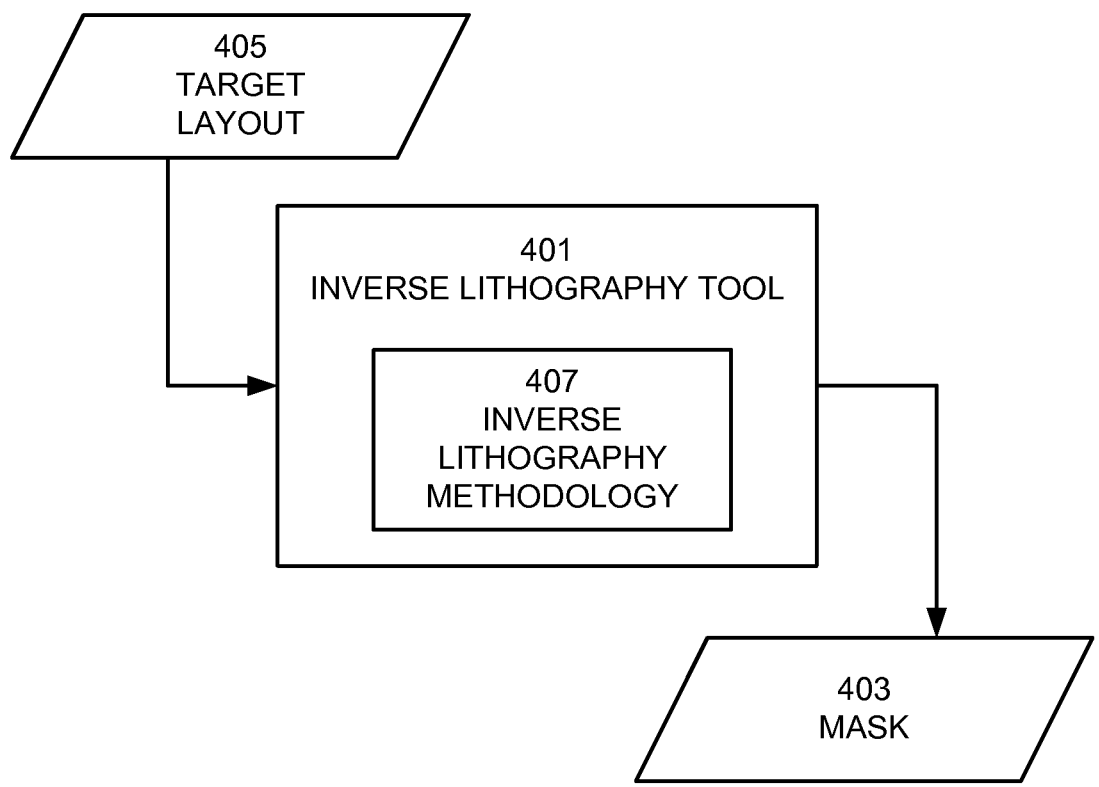
FIG. 4 illustrates an inverse lithography tool.

The target layout 301 may be input into a lithographic tool, such as the lithographic tool 401 illustrated in FIG. 4. As can be seen from FIG. 4, the inverse lithography tool 401 generates a set of mask data 403, based upon a target layout 405 and an inverse lithography module 407. Those of skill in the art can appreciate that the inverse lithography module 407 implements an inverse lithography methodology. For example, the inverse lithography methodologies discussed in U.S. Pat. No. 7,487,489 entitled "Calculation System For Inverse Masks," and filed Feb. 28, 2005 may be implemented by the inverse lithography module 407. U.S. Pat. No. 7,487,489 is incorporated entirely herein by reference.

With various implementations of the invention, the inverse lithography methodology 407 is based in part upon minimizing the following equation to determine a transmission value $I_{i,j}$ for a given pixel.

$$\sum_{i,j} w_{i,j} \cdot (I_{i,j}(m) - T_{i,j})^S \qquad (1)$$

With respect to Equation (1), S is an integer greater than or equal to 2, m is the mask transmission matrix for the pixels, w is the weight matrix for the pixels, I is the intensity matrix for the pixels, T is the target intensity matrix for the pixels. Those of skill in the art will appreciate that the references i and j, denote the $ij^{th}$ element of the respective matrix. Equation (1) is discussed in greater detail in "Source Optimization for Image Fidelity and Throughput", Yuri Granik, $JM^3$ 3(4), pp. 509-522, and in "Model-Based SRAF Insertion Through Pixel-Based Mask Optimization at 32 nm and Beyond" Kyohei Sakajiri et al., *Proceedings of SPIE* 7028, which articles are incorporated entirely herein by reference.

In various implementations of the invention, two parameters, $I_{max}$ and $I_{min}$ are introduced. $I_{max}$ equals the desired intensity level for the areas of the target layout 301 containing features 303, often referred to as "bright regions", while $I_{min}$ equals the desired intensity level for the areas of the target layout 301 devoid of features 303, often referred to as the "dark regions". In various implementations, $I_{max}$ may be defined based upon the peak intensity of the optical lithographic process. Often the optical lithographic process will be optimized for a particular type of printing, such as dense, the type of printing the lithographic process is optimized for is often referred to as the "anchor pattern". Accordingly, $I_{min}$ may be defined by the valley or "bottom" intensity for the anchor pattern.

Figure 5:
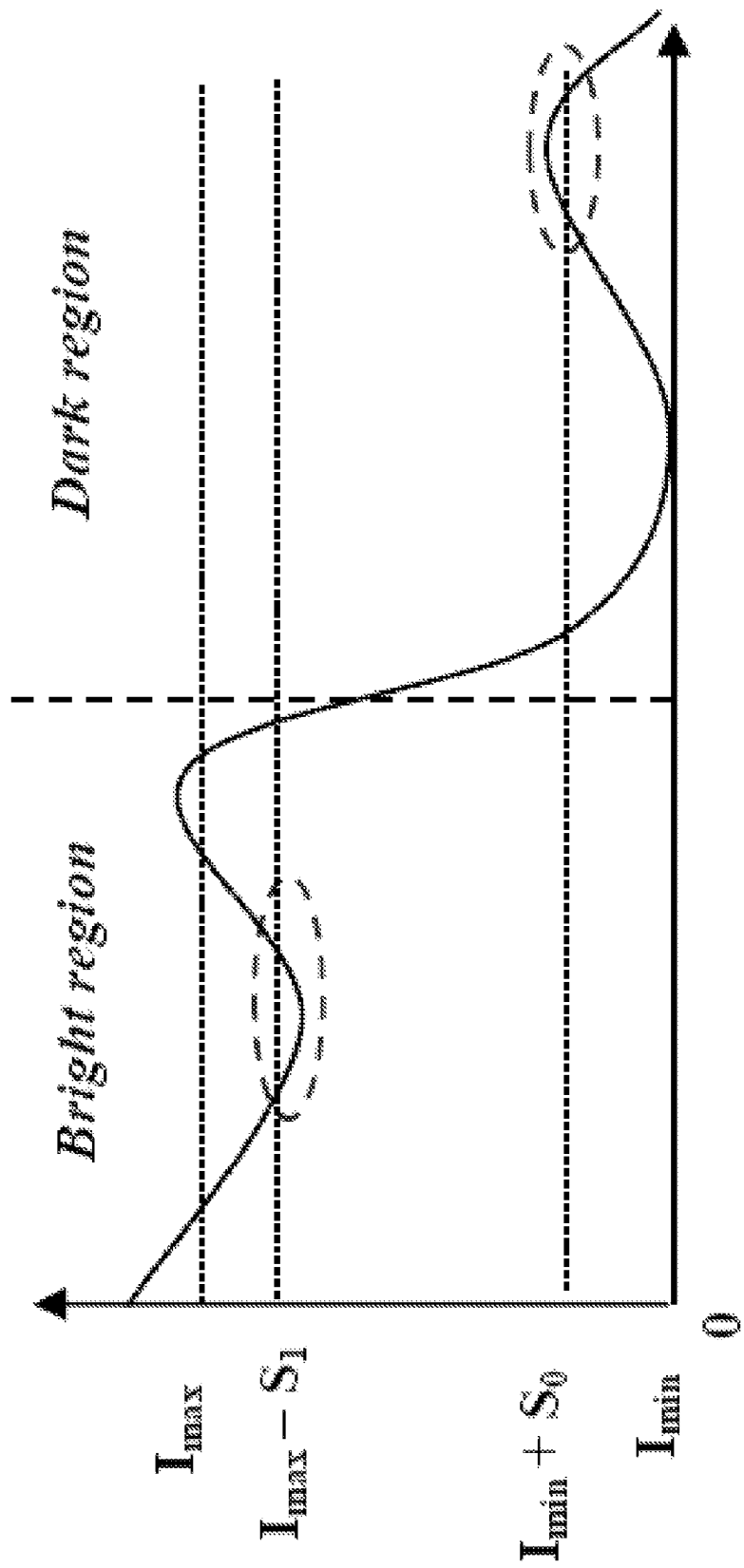
FIG. 5 shows a plot describing the relationship between the intensity of light in an optical lithographic process and the printing of features on a substrate.

FIG. 5 is helpful in understanding the concepts of $i_{max}$ and $I_{min}$. As can be seen from this figure, when the intensity is less than $I_{max}-S1$, errors in printing features 303 of the target layout 301 may result. Alternatively, when intensity is greater than $I_{min}+S0$, unwanted features will often print. These unwanted features often print in the form of "side lobes". In various implementations of the invention, S1 is equal to 1/10 the value of $I_{max}$.

Referring back to Equation (1), various implementations of the invention provide an inverse lithography methodology that minimizes Equation (1), subject to the condition that $I_{i,j} \leq I_{min}+S0$ for the dark region and $I_{i,j} \geq I_{max}-S1$ for the bright regions. Where, S0 and S1 are tolerance parameters. The parameters S0 and S1 are introduced to penalize unwanted conditions such as image intensities lower than $I_{max}-S1$ in the bright region and ones higher than $I_{min}+S0$ for the dark region. More particularly, as FIG. 5 illustrates, Those of skill in the art will appreciate that the tool 401 may be implemented with a variety of inverse lithography methodologies 407. With various implementations of the invention, the tool 401 may be provided by various tools from the Calibre toolset available from Mentor Graphics Corporation of Wilsonville, Oreg. Again, referring back to FIG. 3A, the target layout 301 may be supplied to the inverse lithographic tool 401, which may subsequently generate a set of mask layout 309, as illustrated in FIG. 3C. The mask layout 309 may then be employed to manufacture a physical photomask, which may subsequently be used in an optical lithographic process to print the target layout 301 onto a substrate. Those of skill in the art will appreciate that although layout designs and mask layout are illustrated as drawn layouts, often they are stored, represented, and manipulated as binary logic data stored in graphical description files, such as OASIS or GDSII. Accordingly, mask layout, mask data, mask layout data, layout design, layout data and layout design data are used interchangeably to refer to either a layout design or a mask layout in drawn or data format.

Inverse Lithography for 30% Attenuated Phase Shift Masks

In various implementations of the invention, a high transmission attenuated phase shift mask is designed via an inverse lithography method. The invention may be further understood from the following explanations of examples carried out according to various implementations of the invention. As indicated above, one disadvantage to high transmission attenuated phase shift masks designed by conventional methods was that unintended features were often printed. Particularly, sub resolution assist features (SRAF) are often printed. Sub resolution assist features are often created during processing of a mask to improve the optical fidelity of the manufacturing process. However they are not intended to be printed. With conventional high transmission masks, the sub resolution assist features typically print, which often causes additional errors in the printed image. In addition to the unintended printing of sub resolution assist features, side lobes are frequently printed when high transmission masks designed by prior methods are employed in an optical lithographic process.

Contact Hole Imaging with 30% Attenuated Phase Shift Mask

Figure 7:
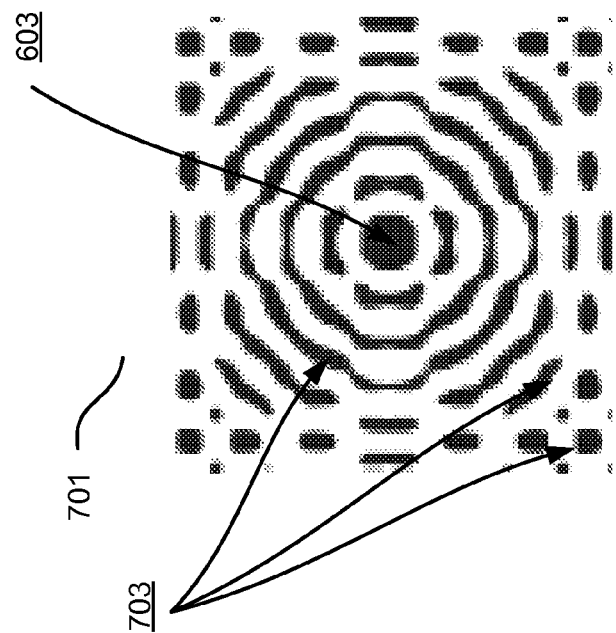
FIG. 7 illustrates a mask corresponding to a portion of the target layout design of FIG. 6.
Figure 6:
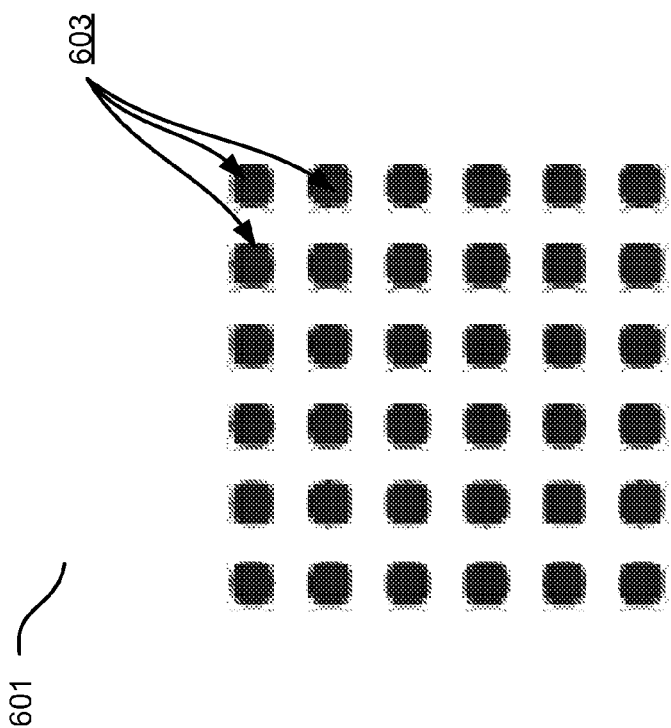
FIG. 6 illustrates a target layout design.

An illustrative example of high transmission masks creation is illustrated by FIGS. 6 and 7. FIG. 6 illustrates a target image 601, including features 603. The target image 601 may often be referred to as a contact hole (CH) array, while the features 603 are referred to as contact holes. Under conventional methods, an attenuated phase shift mask could be created that correctly prints the target image 601. However, the mask would have required a patch material, such as chromium, be applied at locations between the features 603 to suppress the printing of sub resolution assist features during manufacturing. This process is burdensome however since application of a patch material requires an additional step in the mask manufacturing process. Various implementations of the invention may be implemented to provide a set of mask data that correctly prints the target image 601, and does not require a patching step, yet still suppresses the printing of sub resolution assist features. For example, FIG. 7 illustrates a mask 701 corresponding to a region 605 around one feature 603 from FIG. 6. As can be seen from FIG. 7, the mask 701 includes a main feature 603 and assist features 703. In various implementations of the present invention, the main feature 603 has a 100% transmission value, while the assist features 703 have a transmission value of greater than 6%. Still, in various implementations of the present invention, the assist features 703 have a transmission value of between 25 and 35%. The combination of the main features 603 and the assist features 703 enable the region to be manufactured upon a substrate through an optical lithographic process.

Figure 8:
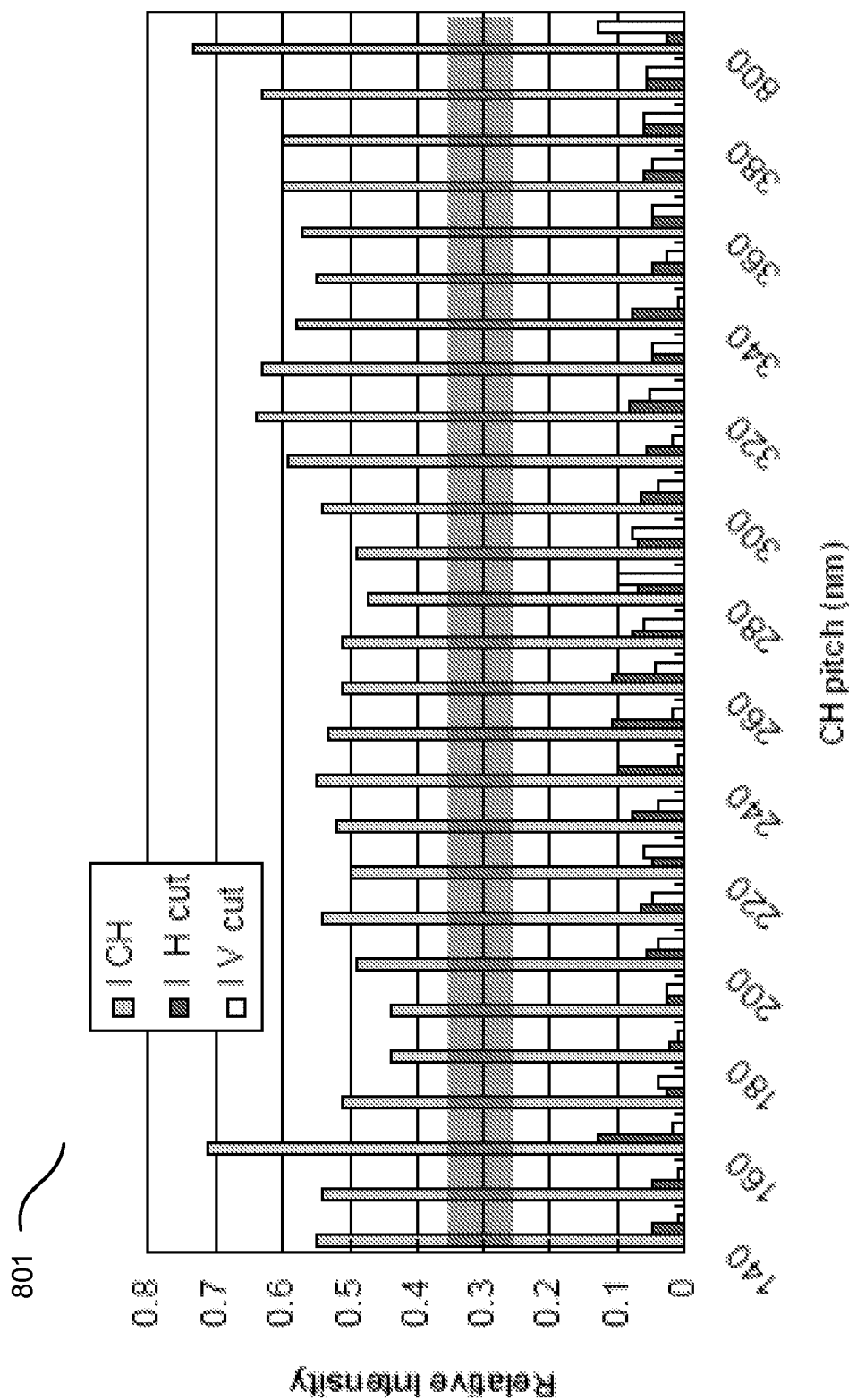
FIG. 8 shows a plot the describes simulated light intensity for various manufacturing processes.

As described above, a set of mask data or a mask is created by minimizing the intensity of the background of the target image while maximizing the intensity of the features 603. FIG. 8 illustrates a chart 801 that shows simulated intensities. The intensities are simulated based upon various contact hole array images or varying pitch. As can be seen from this figure, the intensities near the contact holes (I CH) area greater than a threshold value, while the intensities of the background (I H cut and I V cut) are less than a threshold value.

Improved Mask Error Enhancement Factor

Figure 9:
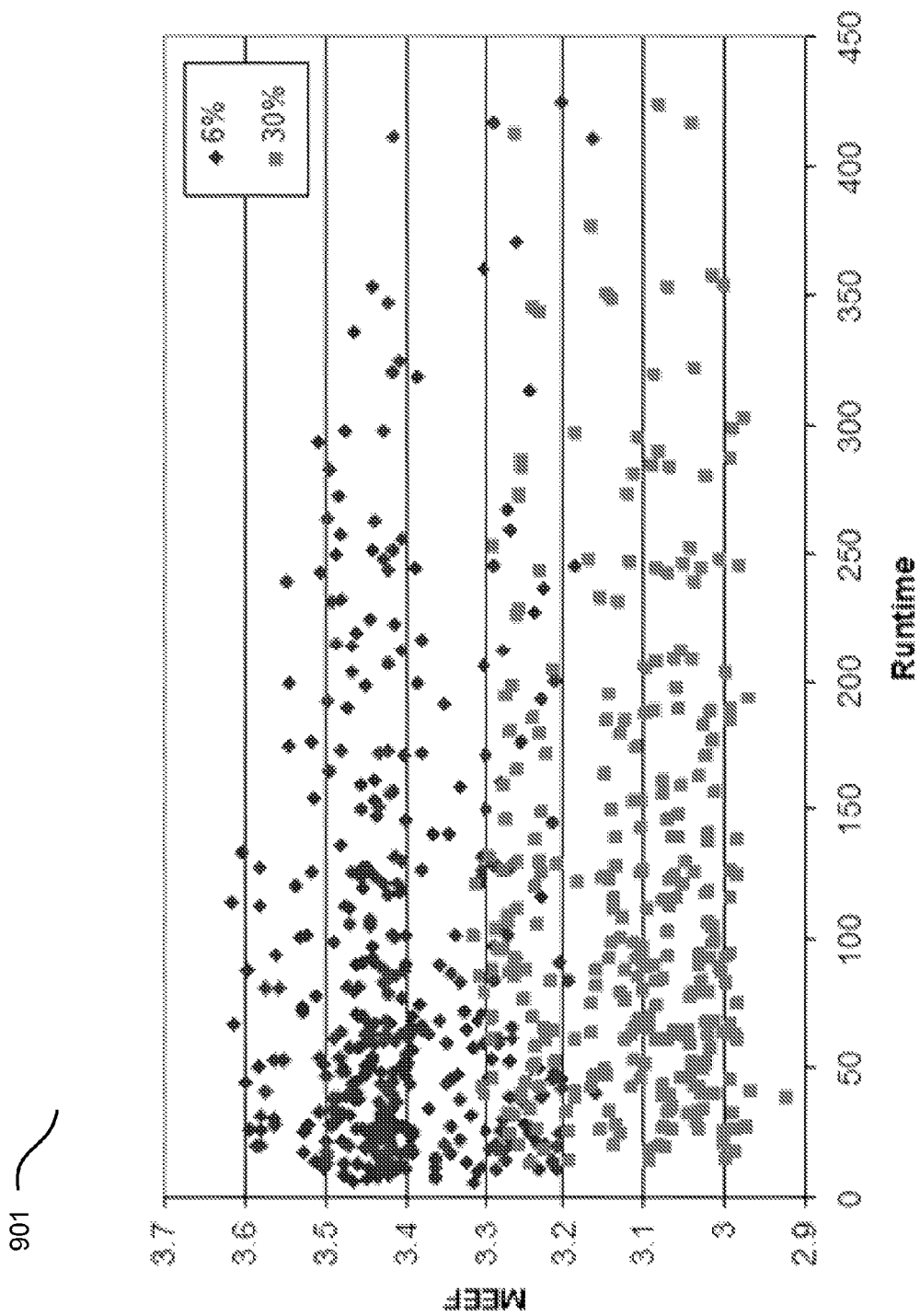
FIG. 9 shows a plot that describes the mask error enhancement factor for a low transmission and a high transmission mask corresponding to the same target layout.

As stated above, high transmission phase shift masks have a lower mask error enhancement factor (MEEF) than their lower transmission counterparts, such as 6% attenuated phase shift masks. FIG. 9 illustrates a plot 901 showing the mean error enhancement factor for a contact hole array, such as the array 601, having a 115 nanometer pitch. As can be seen from this figure, the mask error enhancement factor is clearly lower for the higher transmission mask.

Improved Process Windows

Figure 10:
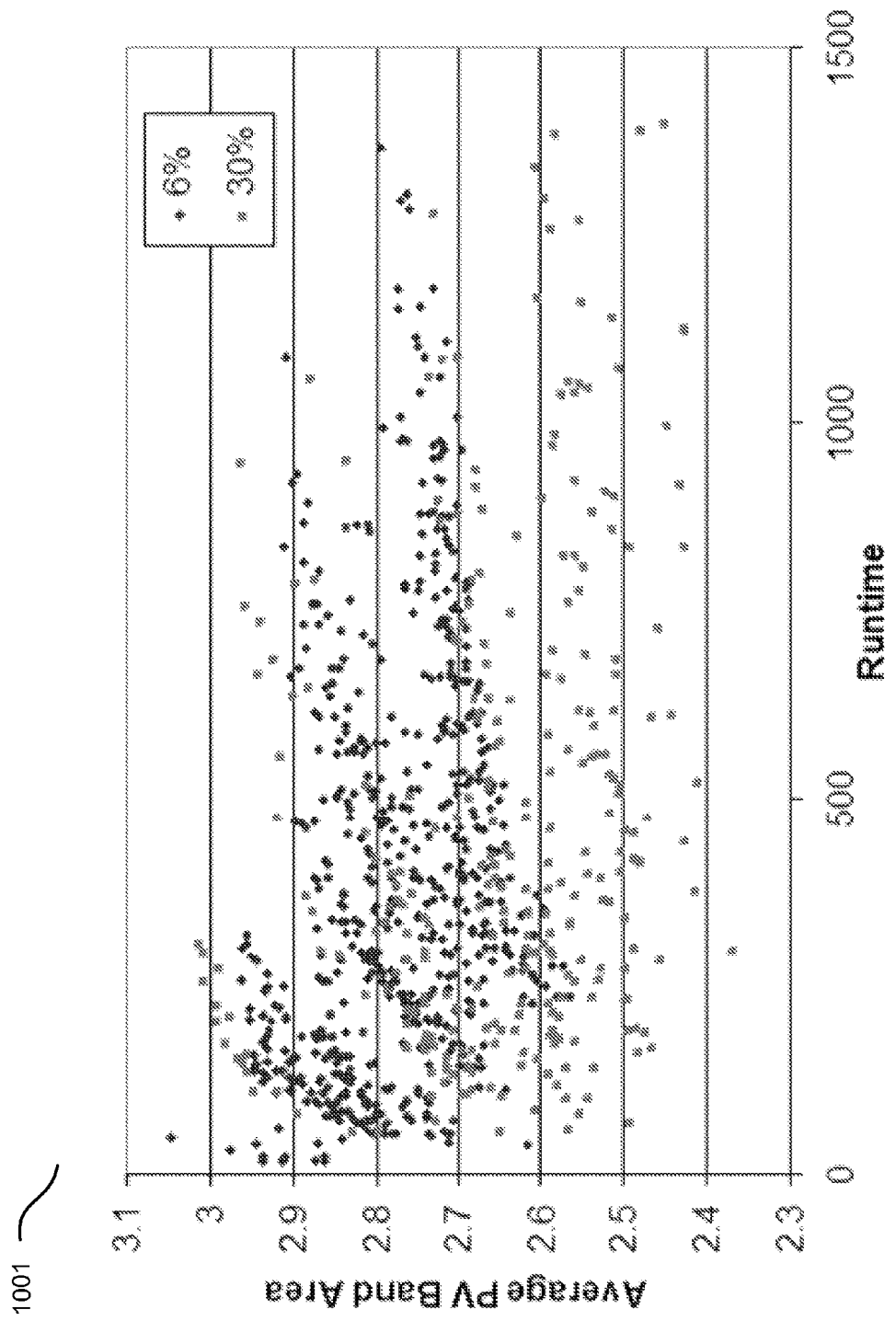
FIG. 10 shows a plot that describes the process variation band area for a low transmission and a high transmission mask corresponding to the same target layout.

In addition to a lower mask error enhancement factor, high transmission phase shift masks have an improved process window. FIG. 10 illustrates a plot 1001 showing the average process variation band area for a random contact hole array. As can be seen from this figure, the process window is better for higher transmission phase shift masks.

Optional Chromium Patterning

Figure 11:
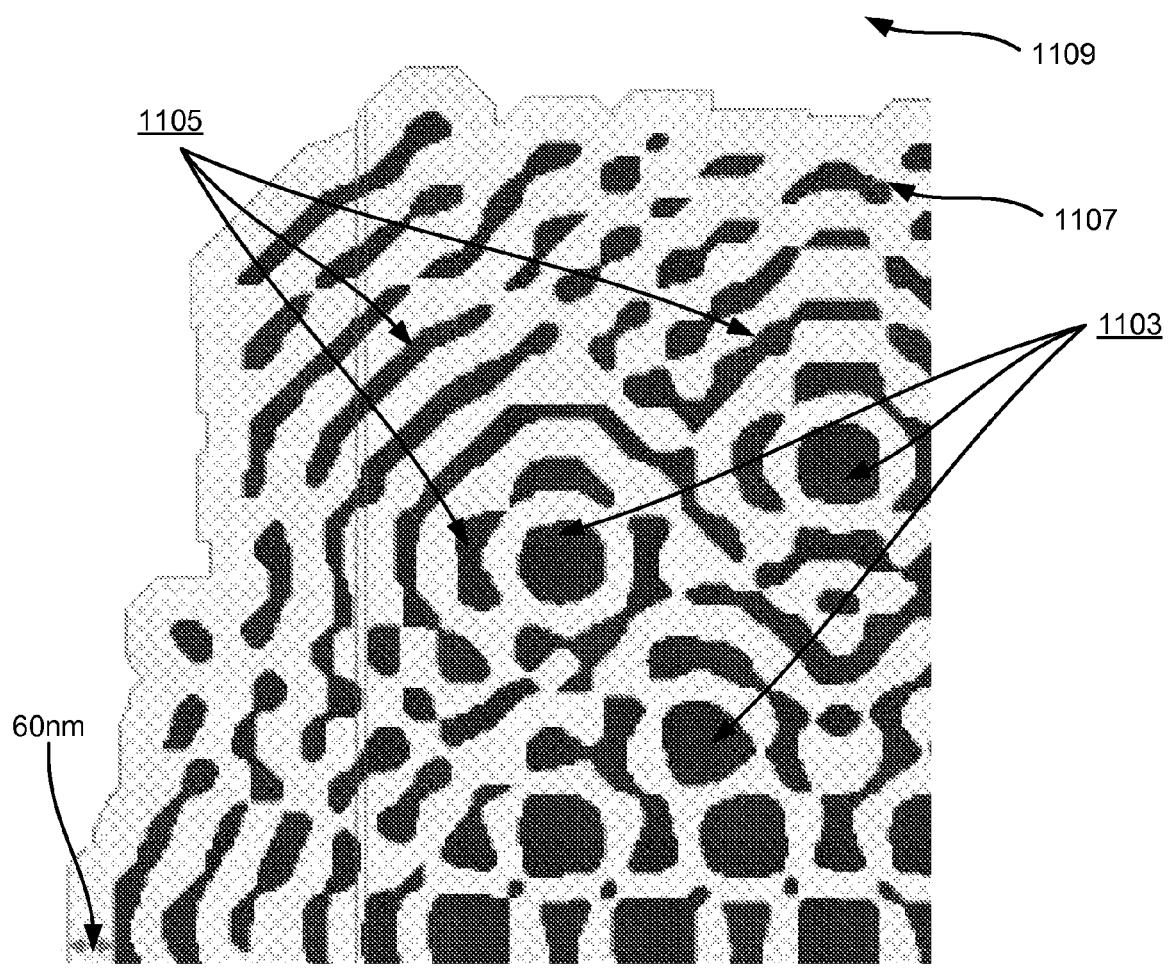
FIG. 11 illustrates a portion of a mask.

In various implementations of the invention, an attenuated phase shift mask may be designed and/or manufactured to include a chromium patch area. For example, FIG. 11 illustrates a portion of a mask 1101 that may be designed according to various implementations of the invention. As can be seen from this figure, the mask 1101 includes main features 1103, assist features 1105, a high transmission area 1107, and a chromium patch area 1109. With various implementations of the invention, the chromium patch area is placed a select distance way from the either main features 1103 or the assist features 1105. For example, FIG. 11 illustrates the chromium patch area 1109 being a distance of 60 nanometers away from either the main features 1103 or the assist features 1105.

CONCLUSION

Various implementations of the invention provide for generation of a high transmission phase shift mask layout through inverse lithography techniques. In various implementations of the present invention, a set of mask data having a plurality of pixels is generated. The transmission value associated with each pixel may then be determined through an inverse lithography technique. With various implementations of the invention, the inverse lithography technique identifies an objective function, minimizes the objective function in relation to a simulation of the optical lithographic process, such that the transmission value, which is greater than 6%, may be determined.

Although certain devices and methods have been described above in terms of the illustrative embodiments, the person of ordinary skill in the art will recognize that other embodiments, examples, substitutions, modification and alterations are possible. It is intended that the following claims cover such other embodiments, examples, substitutions, modifications and alterations within the spirit and scope of the claims.

What is claimed is:

1. A method of generating photolithographic mask data for a mask, the method comprising:
   identifying a target image, the target image corresponding to an image to be printed onto a substrate through an optical lithographic process;
   generating a set of mask data for an attenuated phase shift mark, the mask comprising:
      a main feature having a transmission value of 100%, the main feature comprising an isolated pattern and corresponding to a feature on the target image,
      a plurality of assist features surrounding the main feature and having a linewidth substantially smaller than a linewidth of the main feature, the assist features having a transmission value of 100%, and
      a plurality of phase shift areas having a transmission value of greater than 6%;
   simulating by a computer an intensity on a substrate generated by employment of the set of mask data in the optical lithographic process;
   identifying an objective function that compares the simulation of the intensity to an ideal image intensity corresponding to the target image; and
   minimizing an intensity on the substrate outside the main feature based on the objective function to determine a placement for the plurality of assist features in the set of mask data.

2. The computer implemented method recited in claim 1, further comprising:
   minimizing an intensity on the substrate outside the main feature based on the objective function to determine a size and/or shape for the plurality of assist features in the set of mask data.

3. The method recited in claim 2, further comprising:
   modifying the mask data to include a plurality of patch areas having a transmission value of 0%.

4. The method recited in claim 3, the patch areas covering the plurality of phase shift areas located at least 60 nanometers away from either the main features or a one of the plurality of assist features.

5. The method recited in claim 4, further comprising:
   manufacturing a mask, the mask corresponding to the mask data.

6. The method recited in claim 5, the process of manufacturing a mask comprising:
   performing a first patterning operation on a lithographic mask blank, the first patterning operation causing the main feature and the assist features to be formed on the lithographic mask blank; and
   performing a second patterning operation on the lithographic mask blank, the second patterning operation causing the patch areas to be formed on the lithographic mask blank.

7. The method recited in claim 6, wherein the patch areas are formed from a chromium material.

8. A photolithographic mask produced according to the method recited in claim 6.

9. The method recited in claim 1, further comprising:
   manufacturing a mask, the mask corresponding to the mask data.

10. The method recited in claim 9, the process of manufacturing a mask comprising only a single patterning operation, the single patterning operation being a patterning operation on a lithographic mask blank, the first patterning operation causing the main features and the assist features to be formed on the lithographic mask blank.

11. A photolithographic mask produced according to the method recited in claim 10.

12. The computer implemented method recited in claim 1, the plurality of phase shift area transmission values being within the range of 7% to 35%.

13. The computer implemented method recited in claim 1, the plurality of phase shift area transmission values being approximately 30%.

14. The method recited in claim 1, wherein no feature on the target image corresponds to the assist features.

15. A non-transitory computer readable storage medium having stored thereon instructions which, when executed on a computer, causes the computer to perform a method, the method comprising:
- identifying a target image, the target image corresponding to an image to be printed onto a substrate through an optical lithographic process;
- generating a set of mask data for an attenuated phase shift mask, the mask comprising: a main features having a transmission value of 100%, the main feature comprising an isolated pattern and corresponding to a feature on the target image, a plurality of assist features surrounding the main feature and having a linewidth substantially smaller than a linewidth of the main feature, the assist features having a transmission value of 100%, and a plurality of phase shift areas having a transmission value of greater than 6%;
- simulating an intensity on a substrate generated by employment of the set of mask data in the optical lithographic process;
- identifying an objective function that compares the simulation of the intensity to an ideal image intensity corresponding to the target image;
- minimizing an intensity on the substrate outside the main feature based on the objective function to determine a placement for the plurality of assist features in the set of mask data; and
- saving the mask data to a memory storage location.

16. The non-transitory computer readable storage medium recited in claim 15, the method further comprising:
- minimizing an intensity on the substrate outside the main feature based on the objective function to determine a size and/or shape for the plurality of assist features in the set of mask data.

17. The non-transitory computer readable storage medium recited in claim 16, the method further comprising:
- modifying the mask data to include a plurality of patch areas having a transmission value of 0%.

18. The non-transitory computer readable storage medium recited in claim 17, the patch areas covering the plurality of phase shift areas located at least 60 nanometers away from either the main features or a one of the plurality of assist features.

19. The non-transitory computer readable storage medium recited in claim 15, the plurality of phase shift area transmission values being within the range of 7% to 35%.

20. The non-transitory computer readable storage medium recited in claim 15, the plurality of phase shift area transmission values being approximately 30%.

21. The non-transitory computer readable storage medium recited in claim 15, wherein no feature on the target image corresponds to the assist features.

* * * * *

UNITED STATES PATENT AND TRADEMARK OFFICE
CERTIFICATE OF CORRECTION

PATENT NO. : 8,510,686 B2  
APPLICATION NO. : 13/250971  
DATED : August 13, 2013  
INVENTOR(S) : Eric Henri Jan Hendrickx et al.

Page 1 of 1

It is certified that error appears in the above-identified patent and that said Letters Patent is hereby corrected as shown below:

In the Specification

Col. 10, line 2, please change "illustrates," to --illustrates.--.

Col. 10, line 62, please change "region 605" to --region--.

In the Claims

On page 3, Claim 4, please change "features" to --feature--.

On page 3, Claim 10, please change "features" to --feature--.

On page 5, Claim 18, please change "features" to --feature--.

Signed and Sealed this  
Eleventh Day of November, 2014

Michelle K. Lee  
*Deputy Director of the United States Patent and Trademark Office*

UNITED STATES PATENT AND TRADEMARK OFFICE
CERTIFICATE OF CORRECTION

| | | |
|---|---|---|
| PATENT NO. | : 8,510,686 B2 | Page 1 of 1 |
| APPLICATION NO. | : 13/250971 | |
| DATED | : August 13, 2013 | |
| INVENTOR(S) | : Eric Henri Jan Hendrickx | |

It is certified that error appears in the above-identified patent and that said Letters Patent is hereby corrected as shown below:

This certificate supersedes the Certificate of Correction issued November 11, 2014.
The certificate should be vacated since the claims were denied by the Examiner.
The Claims 4, 10 and 18 are reinstated as set forth in printed patent:
Column 12, line 40, Claim 4, Please change "feature" to -- features --
Column 12, line 66, Claim 10, Please change "feature" to -- features --
Column 14, lines 18 and 19, Claim 4, Please change "feature" to -- features --

Signed and Sealed this
Twenty-third Day of December, 2014

Michelle K. Lee
*Deputy Director of the United States Patent and Trademark Office*

UNITED STATES PATENT AND TRADEMARK OFFICE
CERTIFICATE OF CORRECTION

PATENT NO.      : 8,510,686 B2                                    Page 1 of 1
APPLICATION NO. : 13/250971
DATED           : August 13, 2013
INVENTOR(S)     : Hendrickx et al.

It is certified that error appears in the above-identified patent and that said Letters Patent is hereby corrected as shown below:

In The Claims

In column 12 at line 40, In Claim 4, change "features" (following by the term "main") to --feature--.

In column 12 at line 66, In Claim 10, change "features" (following by the word "main") to --feature--.

In column 14 at line 20, In Claim 18, change "features" (following by the word "main") to --feature--.

Signed and Sealed this
Twentieth Day of October, 2015

Michelle K. Lee
*Director of the United States Patent and Trademark Office*